United States Patent [19]
Aipperspach et al.

[11] Patent Number: 5,778,243
[45] Date of Patent: Jul. 7, 1998

[54] MULTI-THREADED CELL FOR A MEMORY

[75] Inventors: Anthony Gus Aipperspach; Todd Alan Christensen; Binta Minesh Patel; Nghia Van Phan; Michael James Rohn; Salvatore Nicholas Storino; Bryan Joe Talik; Gregory John Uhlmann, all of Rochester, Minn.

[73] Assignee: International Business Machines Corporation, Armonk, N.Y.

[21] Appl. No.: 675,315

[22] Filed: Jul. 3, 1996

[51] Int. Cl.$^6$ ............................ G06F 12/02; G06F 9/40
[52] U.S. Cl. .......................... 395/800.11; 395/200.43; 395/823
[58] Field of Search ......................... 395/377, 479, 395/706, 704, 872, 200.65, 441, 412, 435, 603, 200.43, 200.67, 200.57, 800.11, 800.28; 365/189.01, 230.01, 189.05, 230.08; 364/DIG. 1, DIG. 2

[56] References Cited

U.S. PATENT DOCUMENTS

| | | | |
|---|---|---|---|
| 4,502,118 | 2/1985 | Hagenmaier, Jr. et al. | 395/200.68 |
| 4,954,986 | 9/1990 | Driessen et al. | 365/189.01 |
| 5,051,947 | 9/1991 | Messenger et al. | 395/603 |
| 5,134,705 | 7/1992 | Smith et al. | 395/500 |
| 5,142,676 | 8/1992 | Fried et al. | 395/479 |
| 5,197,138 | 3/1993 | Hobbs et al. | 395/563 |
| 5,226,131 | 7/1993 | Grafe et al. | 395/377 |
| 5,237,662 | 8/1993 | Green et al. | 395/670 |
| 5,297,265 | 3/1994 | Frank et al. | 395/412 |
| 5,301,340 | 4/1994 | Cook | 395/800.24 |
| 5,331,643 | 7/1994 | Smith | 371/22.33 |
| 5,404,550 | 4/1995 | Horst | 364/232.22 |
| 5,430,850 | 7/1995 | Papadopoulos et al. | 395/683 |
| 5,448,709 | 9/1995 | Chandler et al. | 395/872 |
| 5,535,393 | 7/1996 | Reeve et al. | 395/706 |

FOREIGN PATENT DOCUMENTS

| | | |
|---|---|---|
| 0614139A2 | 9/1994 | European Pat. Off. |
| WO9427216 | 11/1994 | WIPO |

OTHER PUBLICATIONS

King et al., IBM Technical Disclosure Bulletin, vol. 19, No. 6, Reducing Complexity of Terminal Network Application Support Programming, (1976) pp. 2125–2129.

Paul H. Bardell et al., "Self-Testing of Multichip Logic Modules", 1982 IEEE Test Conference, pp. 200–204.

Hiroaki Hirata et al., "An Elementary Processor Architecture with Simultaneous Instruction Issuing from Multiple Threads", 1992 ACM, pp. 136–145.

Rafael H. Saavedra–Barrera et al., "Analysis of Multi-threaded Architectures for Parallel Computing", 1990 ACM, pp. 169–178.

R.S. Nikhil et al., "*T: A Multithreaded Massively Parallel Architecture", 1992 ACM, pp. 156–167.

D.S. Renshaw, "Portable Co–Operative Multi–Threading Via Modified Procedural Cell", vol. 37, No. 10, Oct. 1994, pp. 283–284.

Kai Hwang, "Advanced Computer Architecture: Parallelism, Scalability, Programmability", McGraw–Hill, Inc., 1993, pp. 525–531.

Primary Examiner—Daniel H. Pan
Attorney, Agent, or Firm—Birch, Stewart, Kolasch & Birch

[57] ABSTRACT

A multi-threaded memory (and associated method) for use in a multi-threaded computer system in which plural threads are used with a single processor. The multi-threaded memory includes: multi-threaded storage cells; at least one write decoder supplying information to a selected multi-threaded storage cell; and at least one read decoder accessing information from a selected multi-threaded storage cell. Each of the multi-threaded storage cells includes: N storage elements, where $N \geq 2$, each of the N storage elements having a thread-correspondent content; a write interface supplying information to the intra-cell storage elements; and a read interface reading information from the intra-cell storage elements. At least one of the intra-cell read and write interfaces selects one of the thread-correspondent contents based at least in part by identifying the corresponding thread to achieve intra-cell thread-correspondent content selection.

35 Claims, 15 Drawing Sheets

MULTI-THREADED CELL FOR A MEMORY

TECHNICAL FIELD OF THE INVENTION

The present invention is directed toward semiconductor memories for computer systems and more particularly toward a multi-threaded storage element/cell for use in a multi-threaded memory in a microprocessor.

BACKGROUND OF THE INVENTION

A perennial goal in computer architecture is to improve processing speed, i.e., improve processor utilization and/or system throughput. In the most common processor architecture, known as von Neumann architecture, instructions are executed sequentially according to the sequence established by a program. Such processors are described as being single-threaded.

Some instructions cause a processor to be idle. For example, when an instruction requires data to be read from a remote location into one or more of the registers of the processor before a logical operation can take place, then the processor is idle during the time it takes to read the remotely stored data. This situation is referred to as memory latency.

A more detailed example of memory latency is when a processor attempts to read data out of cache memory. If the data is not present in the cache, i.e., if there is a cache miss, then it is necessary for the processor to read the data from a slower remote memory, thus experiencing memory latency.

One of the ways to deal with memory latency is to tolerate it, and one technique for tolerating it is multi-threaded processing. A multi-threaded processor can recognize when an instruction has caused it to be idle, e.g., a memory latency condition occurs, and can switch from the instruction causing the memory latency to another instruction independent from the former instruction. The former instruction is considered a first thread and the latter instruction is considered a second thread. Sometimes a thread is referred to as a "context". If the second thread involves an operation that causes the processor to be idle, the processor will suspend the second thread and switch to a third thread. At some point, the threads that had caused the processor to be idle will be ready, e.g., the memory latency will have passed. At that time, the processor can return to those threads. By switching from one thread to the next, the processor can minimize the amount of time that it is idle. In other words, it can maximize the amount of time that it is busy.

Generally, a thread or context includes a program counter, a register set, and a plurality of write ports and a plurality of read ports for the register set. This is shown in FIG. 1.

FIG. 1 depicts a cell within a 2-threaded storage array, the cell being constructed from standard storage elements. Thread 0 has a plurality of write ports 2, a storage element 4, and a plurality of read ports 6. Thread 1 has a plurality of write ports 8, a storage element 10, and a plurality of read ports 12. The number of write ports and read ports depends upon the number of functional units that can write to and read from the storage element, respectively.

Such a prior art storage array as in FIG. 1 enables the storage element in thread 0 to be written into at the same time that the storage element of thread 1 is written into. Similarly, having separate read ports for the storage element of thread 0 and the storage element of thread 1 enables data to be read from each of thread 0 and thread 1 simultaneously. This is referred to as write independence and read independence, respectively.

In the area of very large scale integrated ("VLSI") circuits, it is crucial to economize the consumption of the surface area of the chip upon which the integrated circuit is formed. As is well known, as VLSI technology has improved, the trend is to form more devices upon smaller integrated circuits, i.e., to increase transistor density. Two principal factors affect transistor density: transistor size; and the number of wires necessary to interconnect the transistors, which is a function of the particular circuit(s) being implemented. Yet the reductions in wire size and minimum spacing between the wires (necessary to prevent capacitive coupling, or crosstalk) have not been as significant as the reductions in transistor size. For a particular circuit that is to be formed from transistors on a chip, this problem of dealing with the surface area consumed by the wire interconnections generally is referred to as the "wireability" of the circuit, i.e., the circuit is referred to as being "wire limited". In effect, for a given circuit, a reduction in surface area consumption achieved by eliminating a transistor is more attributable to the reduction in the surface area consumed by the associated wire interconnections than in the surface area consumed by the transistor itself.

SUMMARY OF THE INVENTION

The inventors have evaluated the advantages and disadvantages associated with read or write independence, i.e. the simultaneous thread reading or writing capability, in terms of the number of transistors necessary to form the write ports of each storage element and the associated wireability.

The prior art assumed that read independence and write independence was absolutely necessary in a multi-threaded memory. The inventors have discovered that this prevalent prior art assumption is incorrect and have developed designs which improve the performance of such prior art systems by dispensing, in whole or in part, with read and/or write independence. The inventors have discovered that these prior art assumptions impose, as a practical matter, unnecessary surface area consumption on the multi-threaded memory.

In particular, in a multi-threaded processor, the inventors have discovered (as a practical matter) that read independence is a seldom used capability. A multi-threaded processor can only read from one thread at a time. Thus, the multi-threaded processor itself never demands read-independence from its register set. Where there are plural multi-threaded processors operating in parallel, there can arise a rare situation in which read-independence might be demanded of the register set for a processor. In such a rare situation, a first processor would read from a first thread while a second processor performs a remote memory read from a second thread of the first processor. The inventors have discovered that eliminating read independence is of negligible negative consequence, as a practical matter, and yet achieves significant savings in surface area consumption due to the transistors that can be eliminated.

Similarly, as a practical matter for some applications, the inventors have discovered that the need to write data into the storage elements of two or more threads at the same time occurs infrequently, so infrequently as to be a negligible advantage. Rather, it is much more common that data is written into the storage elements of thread 0 asynchronously to data being written into the storage elements of thread 1. Consequently, the inventors have discovered that improved surface area economy can be achieved without suffering significant negative consequences because write independence has been determined to be a negligible functional capability.

It is therefore an object of the present invention to solve the problems of the prior art.

It is an object of the present invention to produce a multi-threaded memory, e.g., general purpose register, having a highly economized integrated circuit chip-surface-area consumption.

It is an object of the present invention to achieve a multi-threaded memory formed from an optimally minimized number of transistors.

It is an object of the present invention to achieve a multi-threaded memory having an optimally minimized number of transistors necessary to form read and write ports for the storage elements (corresponding to the threads of a multi-threaded cell) by recognizing that read independence and write independence are negligible functional advantages that can be selectively eliminated with negligible negative consequence, thereby improving the associated wireability which improves the surface area economy.

The above-mentioned discoveries of the inventors have led them to the development of the present invention which fulfills the above objects by providing, in a multi-threaded computer system using plural threads with a single processor, the single processor processing one thread at a time, a multi-threaded memory comprising: a plurality of multi-threaded storage cells; at least one write decoder supplying information to a selected one of the multi-threaded storage cells; and at least one read decoder accessing information from a selected one of the multi-threaded storage cells. Each of the multi-threaded storage cells includes: N storage elements, where $N \geq 2$, each of the N storage elements having a thread-correspondent content; a write interface, operatively connected to the at least one write decoder, and supplying information to the plural storage elements; and a read interface, operatively connected to the at least one read decoder, and reading information from the plural storage elements. At least one of the read and write interfaces selects one of the thread-correspondent contents based at least in part by identifying the corresponding thread, thereby achieving intra-cell thread-correspondent content selection.

The objects of the present invention also are fulfilled by providing a method of thread selection for use with a multi-threaded memory. The multi-threaded memory is formed from a plurality of multi-threaded storage cells incorporated in a multi-threaded computer system using plural threads with a single processor. The single processor processes one thread at a time, and includes at least one write decoder supplying information to a selected one of the multi-threaded storage cells and at least one read decoder accessing information from a selected one of the multi-threaded storage cells. Each multi-threaded storage cells includes N storage elements, where $N \geq 2$, a write interface and a read interface. Each of the N storage elements has a thread-correspondent content. The write interface is operatively connected to the at least one write decoder, and supplies information to the plural storage elements. The read interface is operatively connected to the at least one read decoder, and reads information from the plural storage elements. The method of thread selection includes the steps of: providing each of the N storage elements with a thread-correspondent content; intra-cellularly selecting one of the plurality of thread-correspondent contents based at least in part by identifying the corresponding thread; and connecting the selected one of the plurality of thread-correspondent contents to the single processor through at least one of the write and read interfaces. The step of intra-cellularly selecting one of the plurality of thread-correspondent contents selects by indicating to the cell the thread upon which the single processor is processing and either connecting a data line directly to one of the storage elements, or by shifting the plurality of thread-correspondent contents through the N storage elements until the one thread-correspondent contents resides in a storage element that is connected to one of the write interface and read interface.

The foregoing and other objectives of the present invention will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DETAILED DESCRIPTION OF PREFERRED EMBODIMENTS

FIGS. 3–14b depict various embodiments of the multi-threaded storage cell of the present invention, in varying levels of detail. Each embodiment reflects the discovery that read independence, and/or write independence thought by the prior art to be necessary attributes, are attributes of negligible value when c̣ ...uated in terms of their frequency of use, the chip-surface-area that must be consumed to make them possible, and the degree to which they increase the degree of wireability difficulty.

Figure 1:
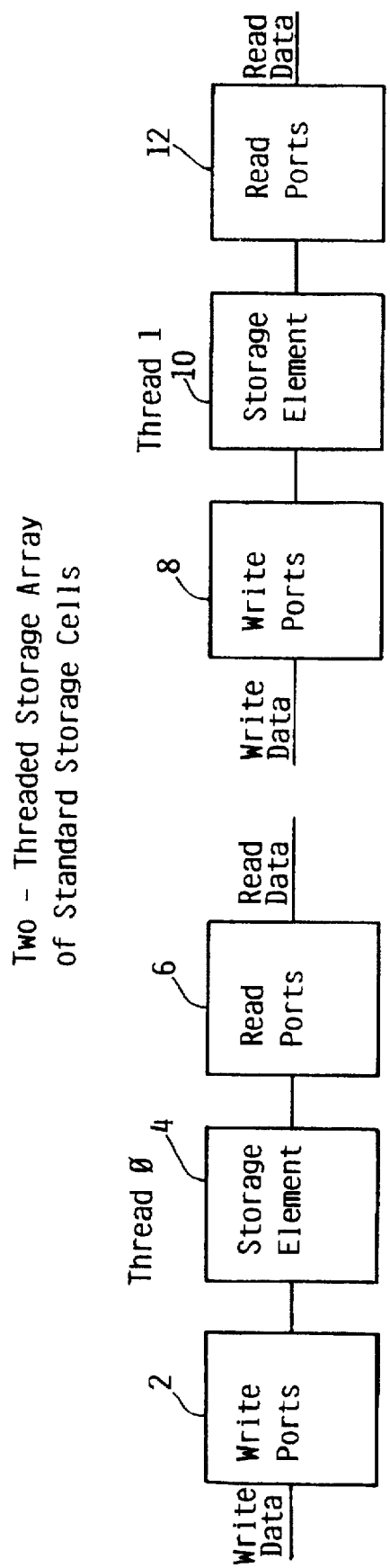
FIG. 1 is a block diagram depiction of a prior art cell in a two-threaded storage array of standard storage elements.
Figure 2:
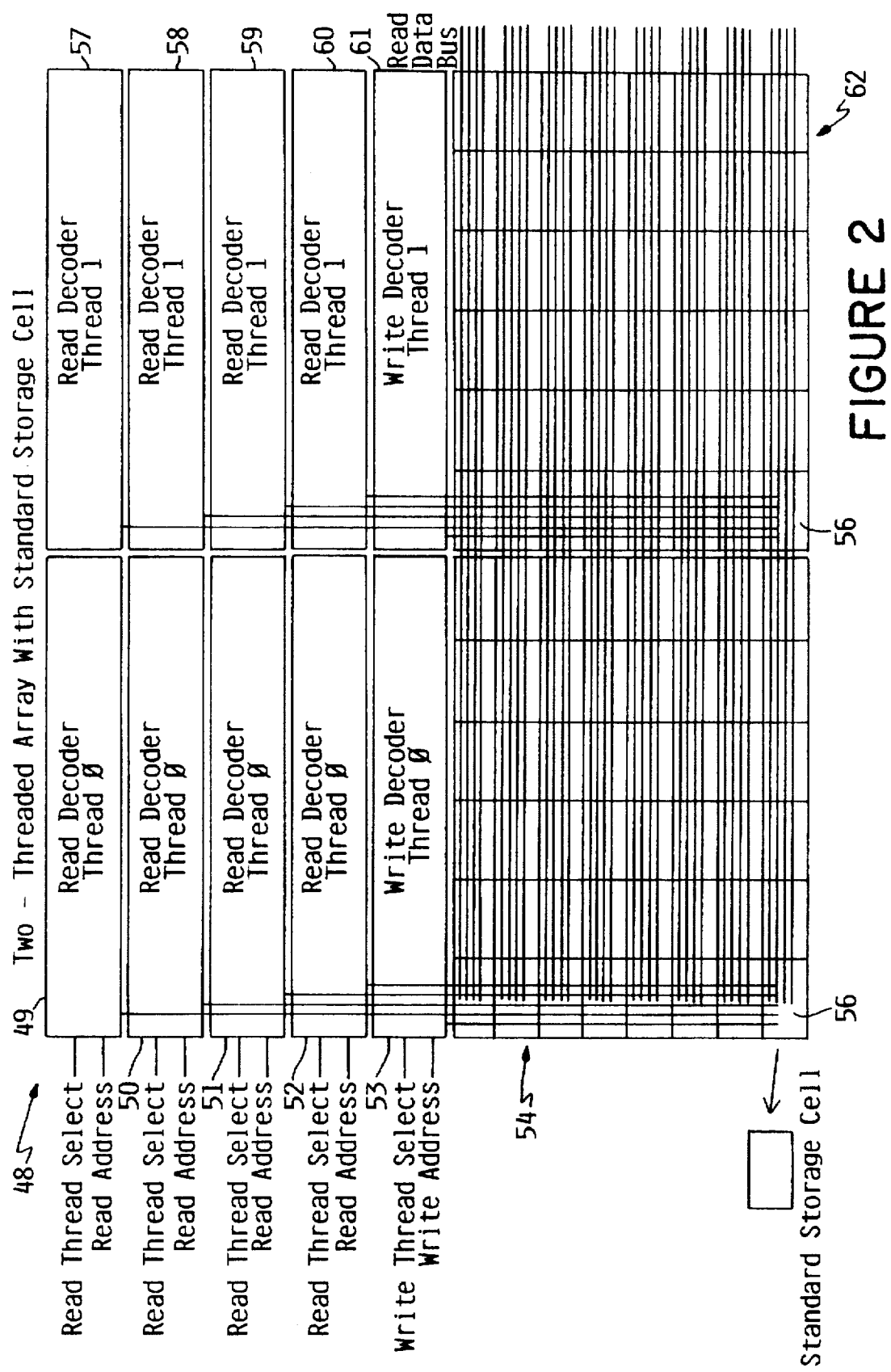
FIG. 2 is a block diagram depiction of a conventional two-threaded array of standard storage cells with a common read data bus.

FIG. 2 depicts a block diagram of a conventional 2-threaded array 48 using standard storage cells. The array 48 includes read decoders 49–52 for thread 0, a write decoder 53 for thread 0, and array 54 of standard storage cells 56 (connected to each of the read decoders 49–52 and the write decoder 52), read decoders 57–60 for thread 1, a write decoder 61 for thread 1, and a second array of storage cells 62 (connected to each of the read decoders 57–60 and the write decoder 61), again formed of the standard storage cells 56. Only the wire interconnections for one of the cells 56 in each of the arrays 54 and 62 are shown because the same connections exist for the other storage cells in the arrays 54 and 62, respectively. Thread selection (by the decoders 49–53 and 57–61) is accomplished externally to each cell in the array, i.e., rather than intra-cellularly.

Though the conventional 2-threaded array of FIG. 2 has a common read data bus, it nevertheless reflects the assumption that read independence a necessary functional attribute because it requires two read decoders thereby enabling data from each of thread 0 and thread 1 to be read simultaneously. Again, the inventors have discovered that a multi-threaded memory having an optimized wireability (and associated optimally minimized transistor count) can be achieved by eliminating read independence, without suffering significant negative consequences, because the number of instances in which it is necessary to simultaneously read from two or more threads is negligible.

Figure 3:
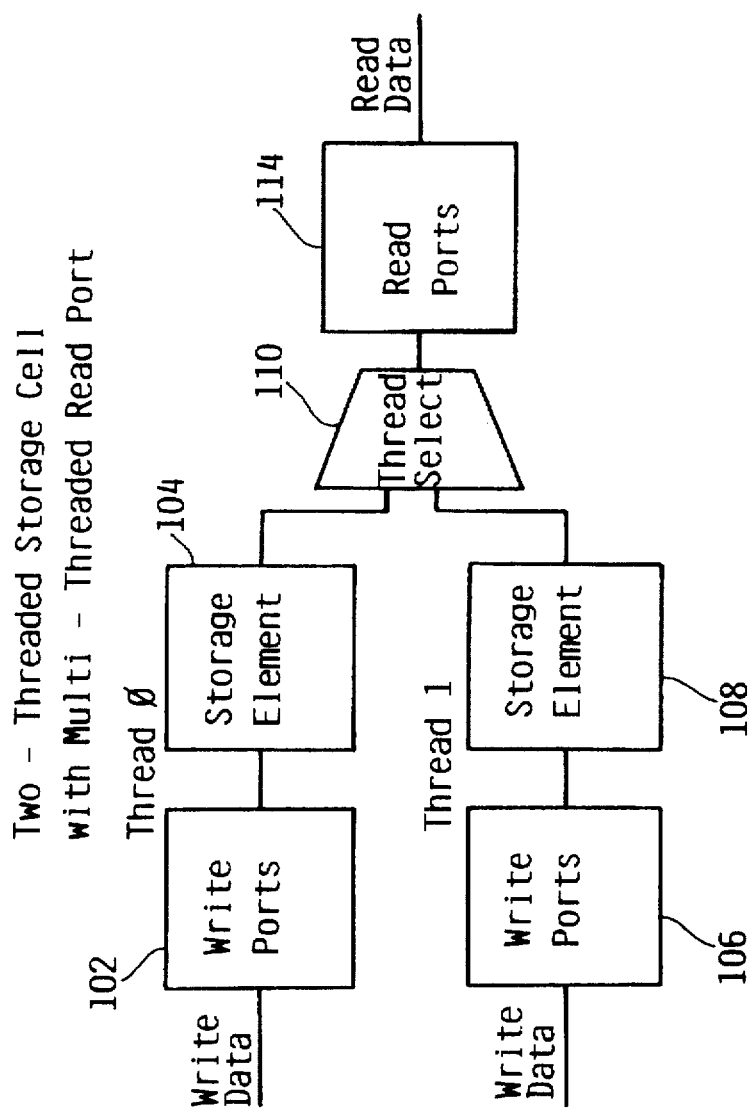
FIG. 3 is a block diagram depiction of a first embodiment of the multi-threaded storage cell of the present invention.

FIG. 3 depicts a block diagram of a first embodiment of the multi-threaded storage cell of the present invention. In particular, FIG. 3 shows a multi-threaded read interface including a thread selector 110 for selectively connecting threads 0 and 1 to the read ports 114. The number of read ports 114 corresponds to the number, usually more than one (e.g., six or eight), of functional units that can read from storage elements 104 and 108. An example of a functional unit is an arithmetic logic unit (ALU) that can perform integer, logical, shifting, field extraction and/or floating point operations and/or conversions between integer and floating point number representations. For a read operation, each storage element is connected to a functional unit as follows: the storage element is connected to the selector 110; the selector 110 is connected to one of the ports 114; this one port is connected to a decoder; and the decoder is connected to the functional unit.

FIG. 3 also includes write ports 102 for thread 0 and write ports 106 for thread 1 (the number of write ports corresponding in number to the number, usually more than one, e.g., three or twelve, of functional units that can write to the storage element 104), storage element 104 for thread 0 (connected to the write ports 102 and the thread selector 110), and storage element 108 for thread 1 (connected to the write ports 106 and the thread selector 110).

The multi-threaded cell of FIG. 3 reflects the inventors' discovery that consumption in chip-surface area can be reduced significantly, by elimination of read independence, without suffering substantial negative consequences because read independence is a negligible functional attribute for a single processor that can only access one thread at a time. Fewer transistors are required to form the thread selector 110 and the read ports 114 than would have been necessary to form separate read ports (as in the prior art) for each of thread 0 and 1, thereby achieving an increased surface area economy without suffering a significant negative consequence.

For the multi-threaded storage cell of FIG. 3, a processor (not shown) can read the data in the storage element 104 by controlling the thread selector 110 to select thread 0, thereby making the data of storage element 104 available on the read ports 114. Similarly, to read the data in the storage element 108, it is necessary for the processor to control the thread select 110 to selector the line from the storage element 108.

Figure 4:
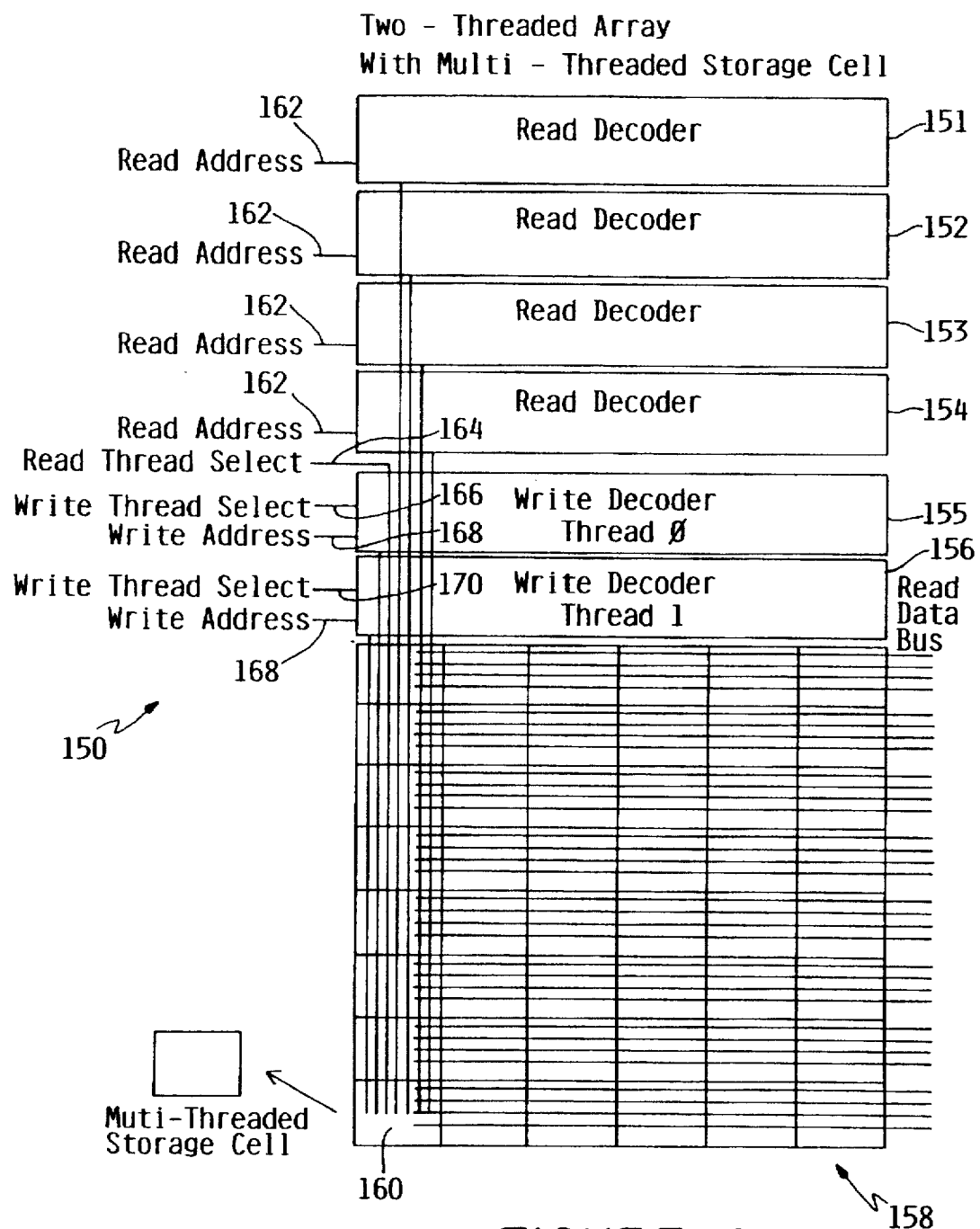
FIG. 4 is a more detailed block diagram depiction of the embodiment of FIG. 3.

FIG. 4 depicts a more detailed block diagram of the embodiment of the FIG. 2. FIG. 4 shows a two-threaded array 150 formed from multi-threaded storage cells 160. The two-threaded array 150 of FIG. 4 includes read decoders 151–154, a write decoder 155 for thread 0, a write decoder 156 for thread 1, and an array 158 of the multi-threaded storage cells 160. Again, only the wire interconnections for one of the storage cells 160 are shown because the interconnections for the other cells in the array 158 are the same.

Each of the write decoders 154 and 156 is connected to a write address bus 168 and is connected to its own write thread select line 166 and 170, respectively. In other words, the thread selection is made externally to the two-threaded register 150. In contrast, the read decoder, e.g., 152, is connected to the read address bus 162 but not connected to the read select line 164. Rather, each of the memory cells 162 is connected to the read select line so that the selection of which thread to read takes place within, rather than externally to, the multi-threaded storage cell 160.

Conventional FIG. 2 has the advantage over FIG. 4 in that only four, rather than eight, decoders are necessary. Not only does this eliminate the consumption of surface area associated with the four extra decoders as well as the control logic associated with the four extra decoders, but this also eliminates the consumption of surface area associated with the wire interconnections running from each of the decoders 57–60 to each of the cells 56 in the array 62. As such, the wireability of the array 150 of FIG. 4 is superior to the wireability of the array 54 of FIG. 2. Also, because the number of storage cells 160 in FIG. 4 is one-half the number of storage cells 56 in FIG. 2, the read data bus that would be associated with FIG. 4 can be shorter, e.g., which contributes to a faster response due to a decreased signal propagation time. It is noted that FIG. 4 has been depicted with four read decoders, but any number could be used including only one.

Figure 5:
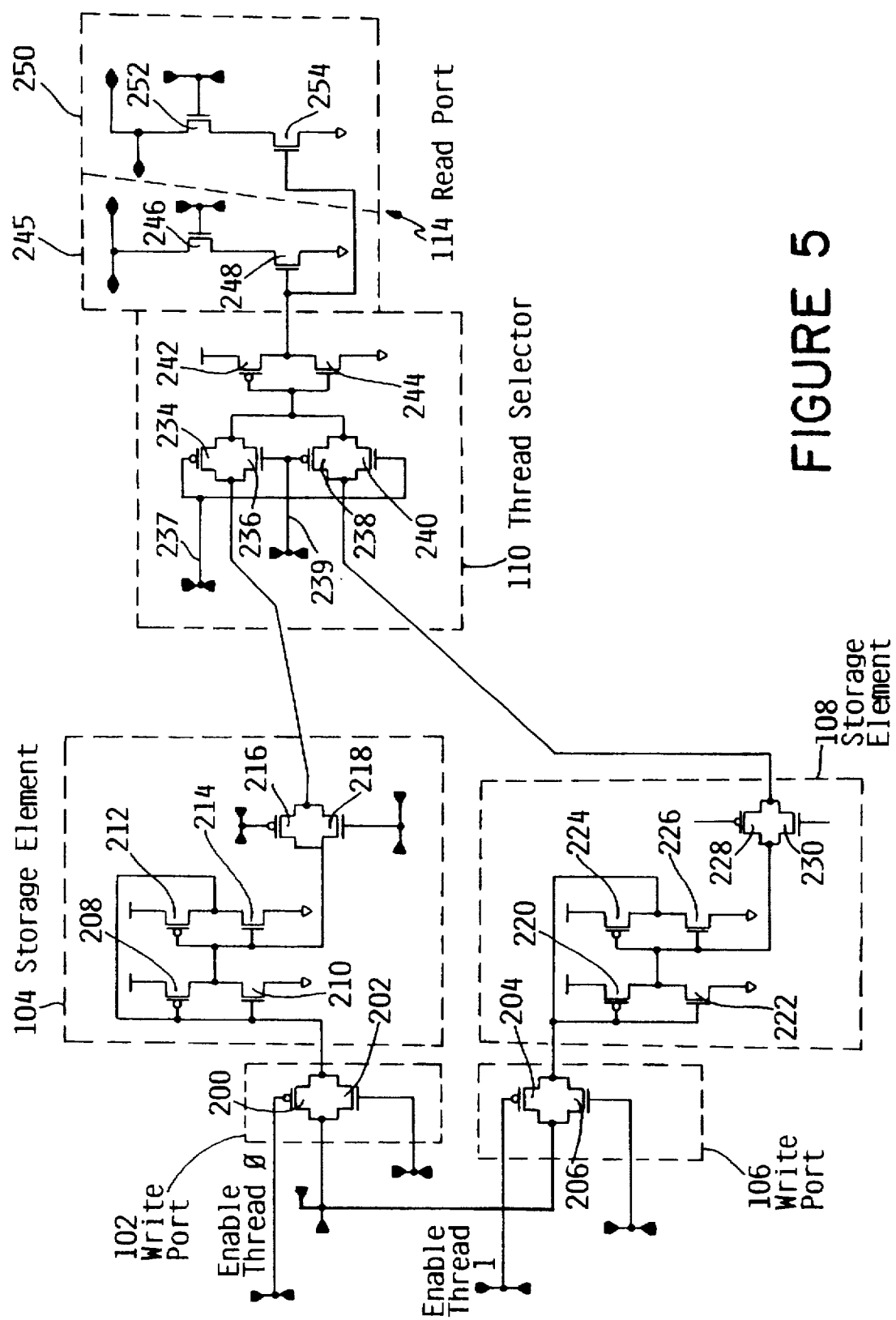
FIG. 5 is a schematic depiction of the embodiment of FIG. 3.

FIG. 5 depicts a schematic diagram of the embodiment of FIG. 3. In particular, the blocks of FIG. 3 are shown as having been formed from CMOS transistors, although the invention is applicable to NMOS, BICMOS, BINMOS, bipolar, SOI, and GaAS, among other technologies. The storage element 104 is formed from the transistors 208–218 and holds a single bit. The write port(s) 102 is shown as only having a single port (because of a simplifying assumption of only one functional unit writing to the storage element 104), though, as stated above, there could be more than one such functional unit formed from transistors 200–202. Similarly, the write port(s) 106 is formed from transistors 204–206. The storage element 108 is formed from transistors 220–230.

The thread selector 110 is formed from the transistors 234–244. Based upon the states of the signal "THB" on line 237 (connected to the gate of transistor 234 and the gate of transistor 240), and the signal "THA" on line 239 (connected to the gate of transistor 236 and the gate of transistor 238), the thread selector 110 selects either the first or second thread. The read port(s) 114 includes two ports, the first port 245 being formed from the transistors 246–248 and the second port 250 being formed from the transistors 252–254. Again, the number of ports at each interface is exemplary and, in practice, will vary according to the number of functional units that can write/read to/from a storage element.

Figure 6:
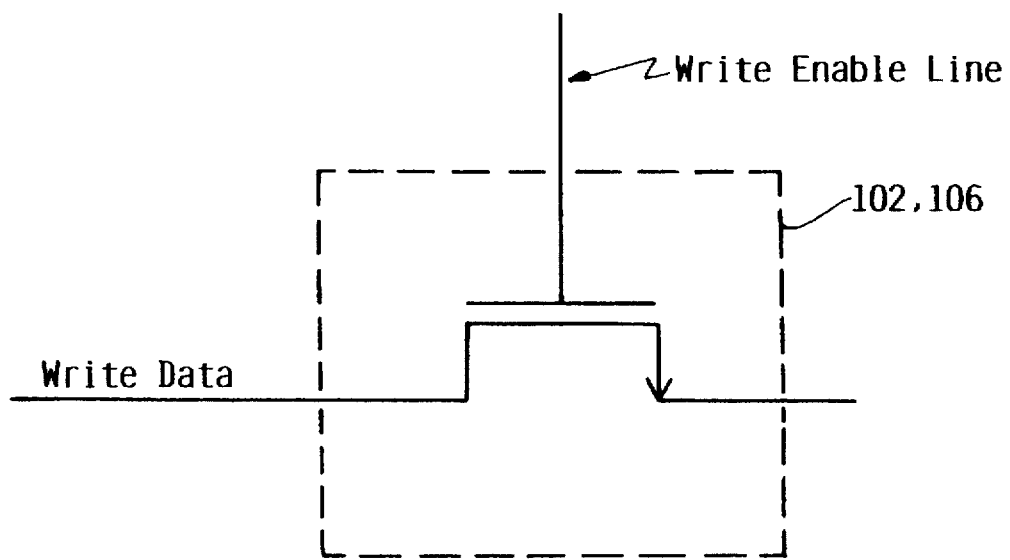
FIG. 6 is an alternative way to realize the write ports of the embodiment of FIG. 5.

FIG. 6 shows that the write ports of the first embodiment, e.g., 102 and 106 of FIG. 3, can be configured as pass gates rather than as transmission gates (as depicted in FIG. 5). Alternatively, set/reset gates or dual-ended pass gates, among others, could be used.

Figure 7:
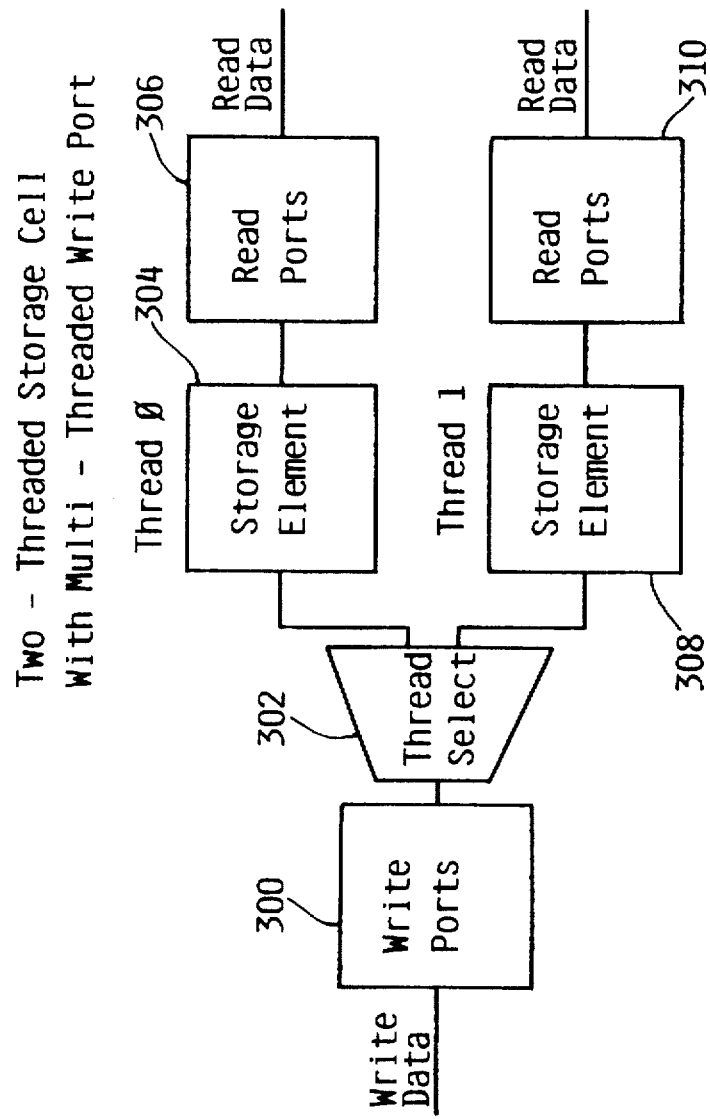
FIG. 7 is a block diagram depiction of a second embodiment of the multi-threaded storage cell of the present invention.

FIG. 7 depicts a block diagram of a second embodiment of the multi-threaded storage cell of the present invention. FIG. 7 includes a single set of write ports 300 supplying data to a thread selector 302, a storage element 304 for thread 0 (connected to the thread selector 302), read ports 306 for thread 0 (connected to the storage element 304), a storage element 308 for thread 1 (connected to the thread selector 302), and read ports 310 for thread 1 (connected to the storage element 308). Once again, the number of write ports and read ports will correspond to the number of functional units that can write to and read from the storage elements 304 and 308, respectively. For a write operation, each functional unit is connected to a storage element as follows: the functional unit is connected to a write decoder; the write decoder is connected to one of the ports 300; this port is connected to the write selector 302; and the write selector 302 is connected to each of the storage elements.

Again, as a practical matter, the inventors have discovered that a multi-threaded memory having an optimized wireability (and associated optimally minimized transistor count) can be achieved (in some applications) without substantial negative consequences by eliminating write independence because there are relatively few instances in which data is available at the same time to be written into each of the storage element 304 of thread 0 and 308 of thread 1. Thus, in this embodiment, the inventors have eliminated write independence functional capability (e.g., as in FIG. 7) to achieve a significant increase in surface area economy without suffering a significant negative consequence.

Figure 8:
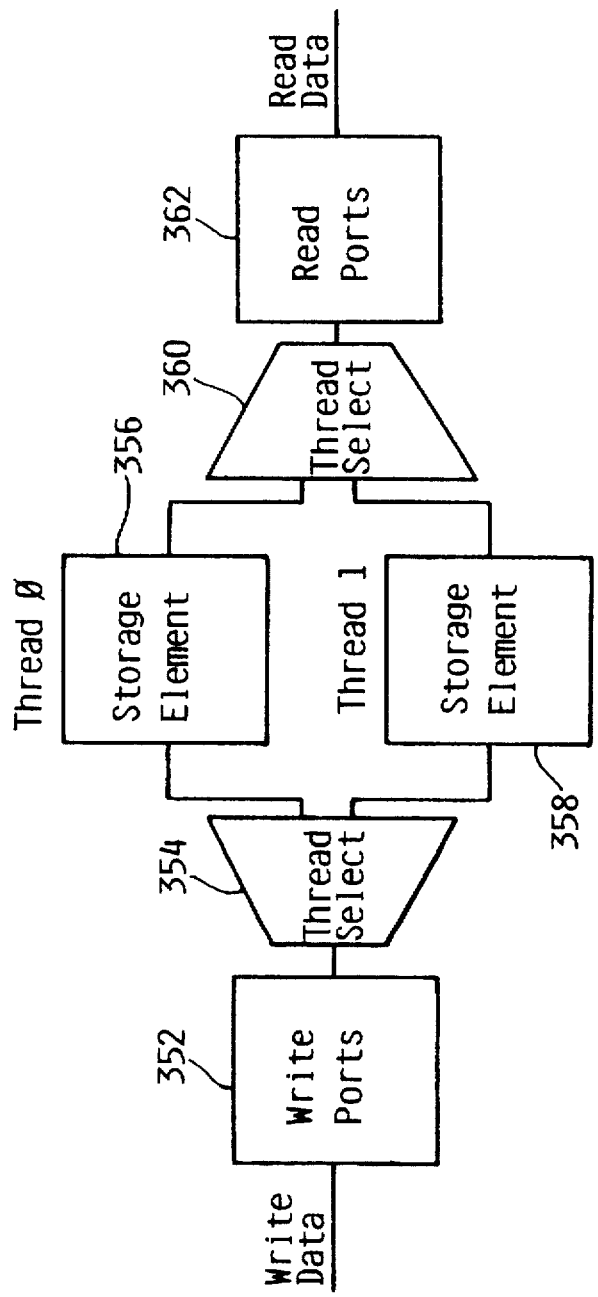
FIG. 8 is a block diagram depiction of a third embodiment of the multi-threaded storage cell of the present invention.

FIG. 8 depicts a block diagram of a third embodiment of the multi-threaded storage cell of the present invention. In FIG. 8, the storage element 356 of thread 0 and the storage element 358 of thread 1 are both connected to a single set of write ports 352 via a thread selector 354. Similarly, the storage elements 356 and 358 are both connected to a single set of read ports 362 via a thread selector 360.

Figure 9:
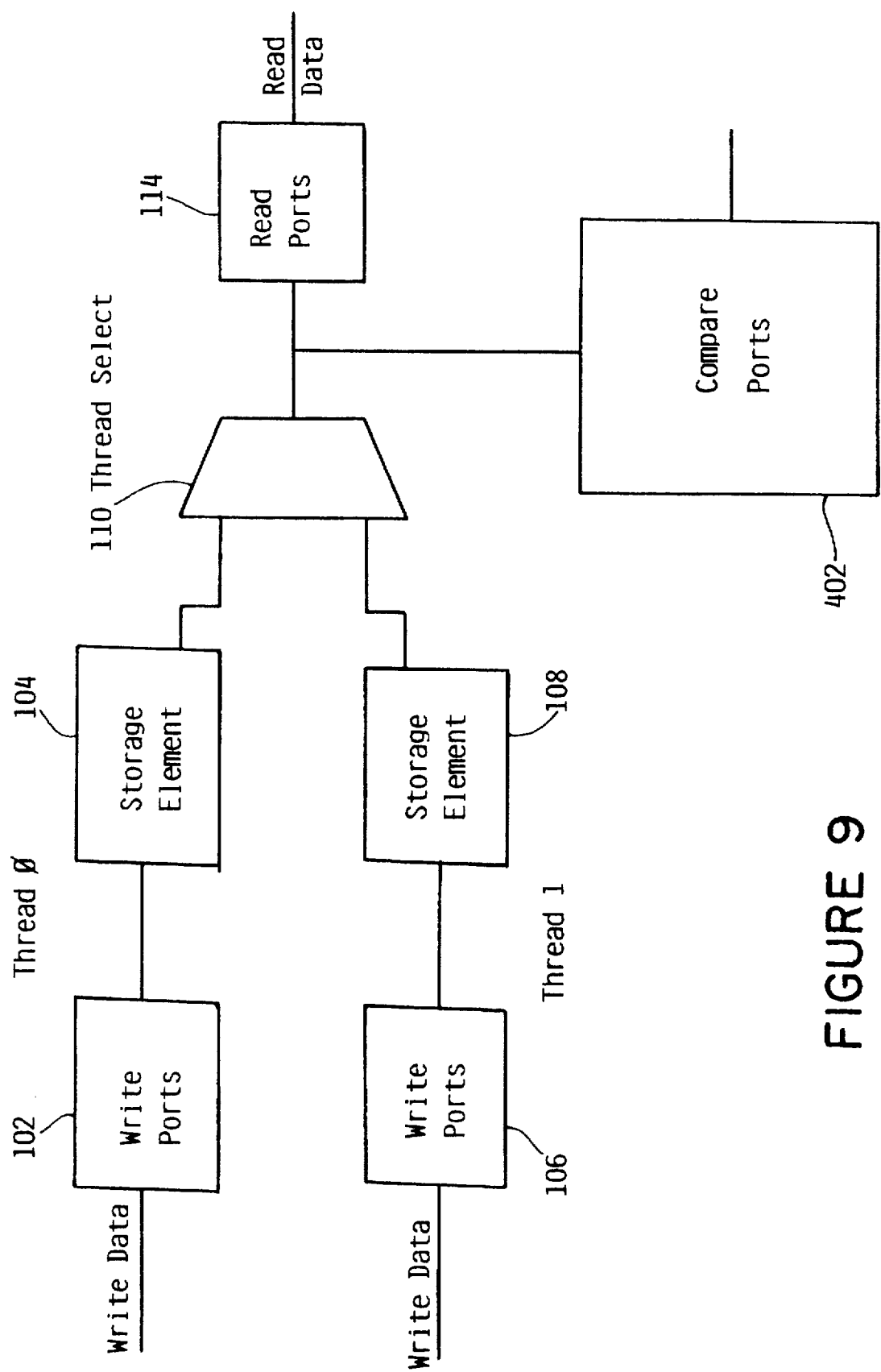
FIG. 9 is a block diagram depiction of a content addressable version of the embodiment of FIG. 3.

FIG. 9 depicts a block diagram of a content addressable version of the embodiment of FIG. 3. Elements that are the same as in FIG. 3 will be referred to by the same reference number. FIG. 9 differs from FIG. 3 only in that, not only the read port 114, but also the compare ports 402 receives the output of the thread selector 402. Content addressable memories are well known and only a brief amount of additional description will be provided.

Figure 10:
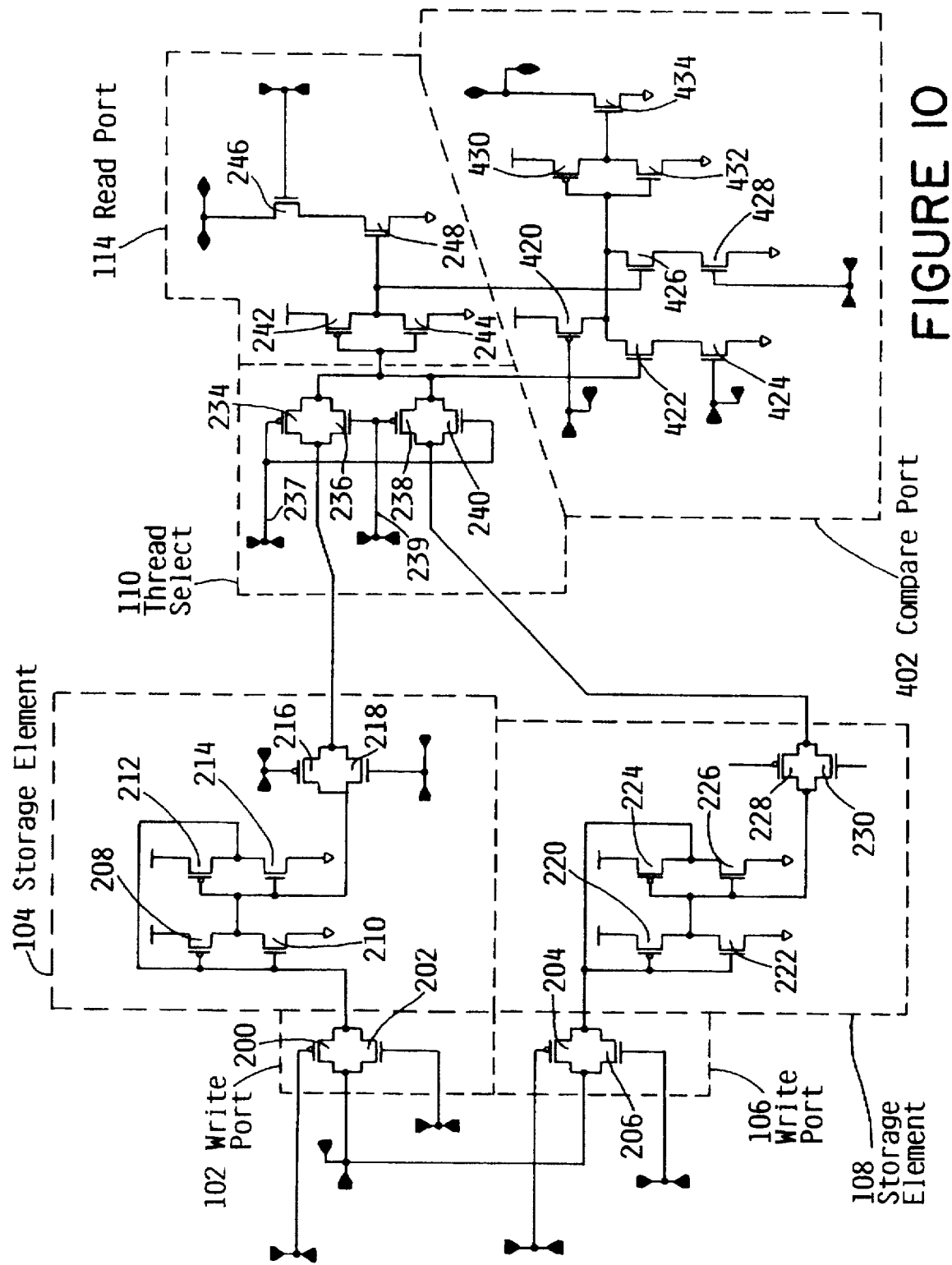
FIG. 10 is a schematic depiction of the content addressable version of the depicted in FIG. 9.

FIG. 10 schematically depicts the content addressable version depicted in FIG. 9. Port 402, for simplicity, is shown as only including a single port formed by the transistors 420–434, but two or more such ports could be used.

Figure 11:
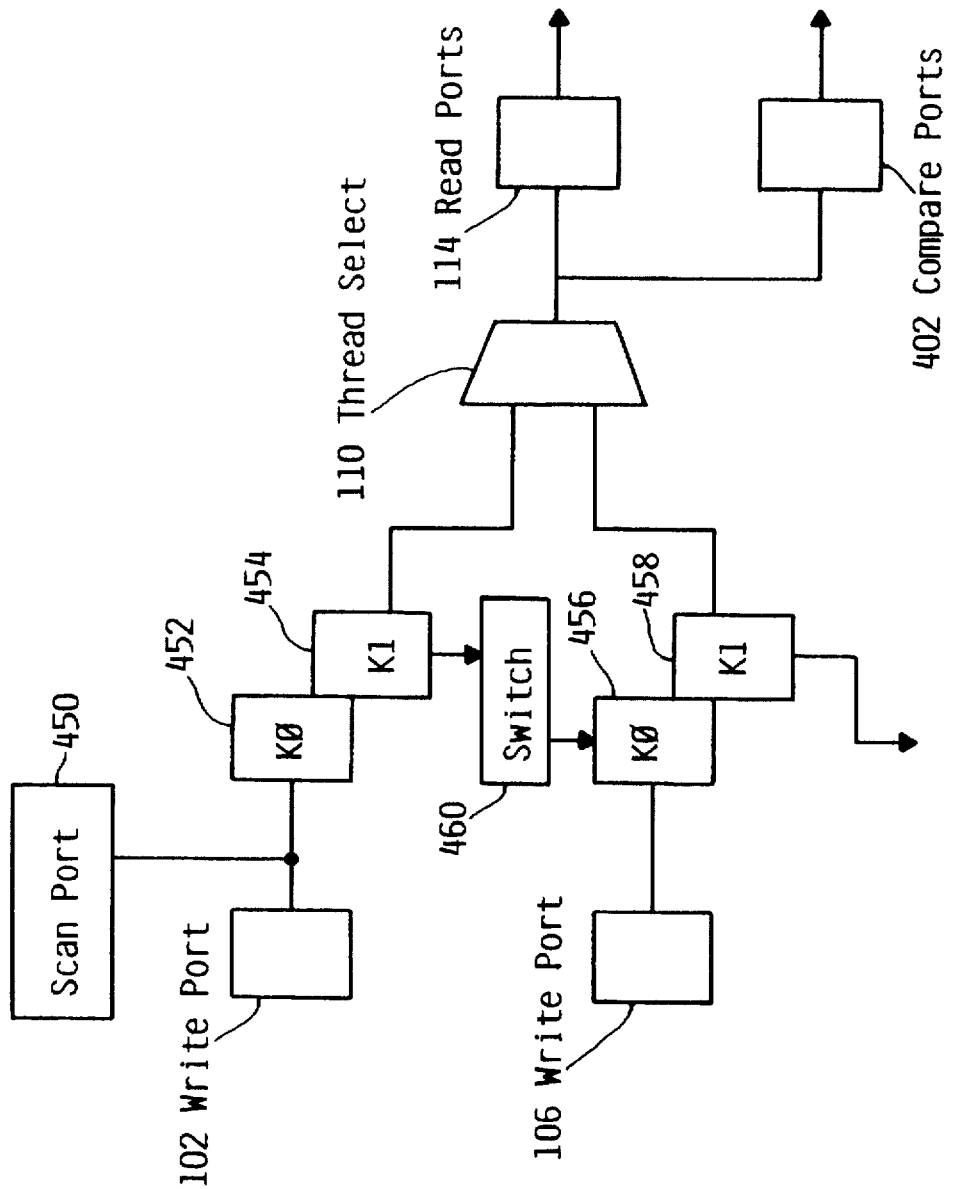
FIG. 11 is a block diagram depiction of a self-testing content addressable version of the embodiment of FIG. 3.

FIG. 11 depicts a block diagram of a self-testing content addressable version of the embodiment of FIG. 3. FIG. 11 differs from FIG. 9 in that the storage element 104 has been replaced by the latches 452 and 454 while the storage element 108 has been replaced by the latches 456 and 458. Also, the switch 460 connects the latch 454 to the latch 456. In addition to the write port 102, the latch 452 receives data from the scan port 450. The path from the scan port 450, through the latches 452 and 454, through the switch 460, and through the latches 456 and 458 integrates a level sensitive scan design ("LSSD") methodology into the multi-threaded memory cell of the first embodiment.

The pairs of latches 452 & 454 and 456 & 458 act as master and slave latches forming a shift register latch pair. These latch pairs are connected together via the switch 460. Together with other similarly constructed memory cells, such a string of master/slave latch pairs operate in many ways like a shift register. Known data can be circulated, i.e., scanned, through this quasi-shift-register to test whether the circuitry is operating properly. Such LSSD techniques are well known, for example as represented by U.S. Pat. No. 5,331,643 to Smith, which is hereby incorporated by reference.

Figure 12:
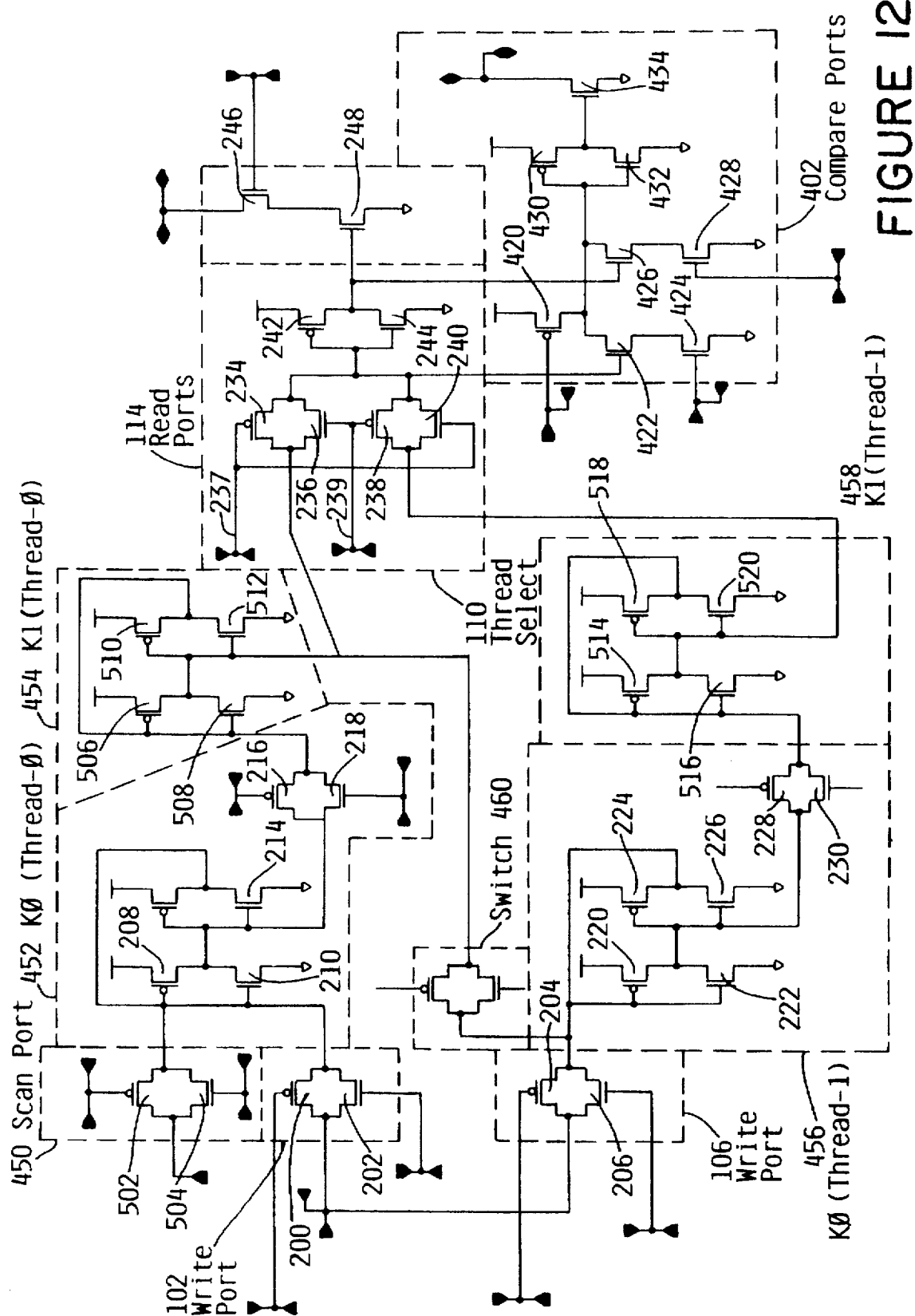
FIG. 12 is a schematic depiction of the self-testing content addressable version depicted in FIG. 11.

FIG. 12 schematically depicts the self-testing content addressable version depicted in FIG. 11. The scan port 450 is formed from the transistors 502–504. The latch 452 corresponds to the storage element 104 of FIG. 5 and is formed from transistors 208–218. Similarly, the latch 456 corresponds to the storage element 108 of FIG. 5 and is formed from transistors 220–228. The latch 454 is formed from the transistors 506–512. The latch 458 is formed from the transistors 514–520.

The version of the first embodiment depicted in FIG. 11 could also be varied by eliminating the compare ports 402.

Figure 13:
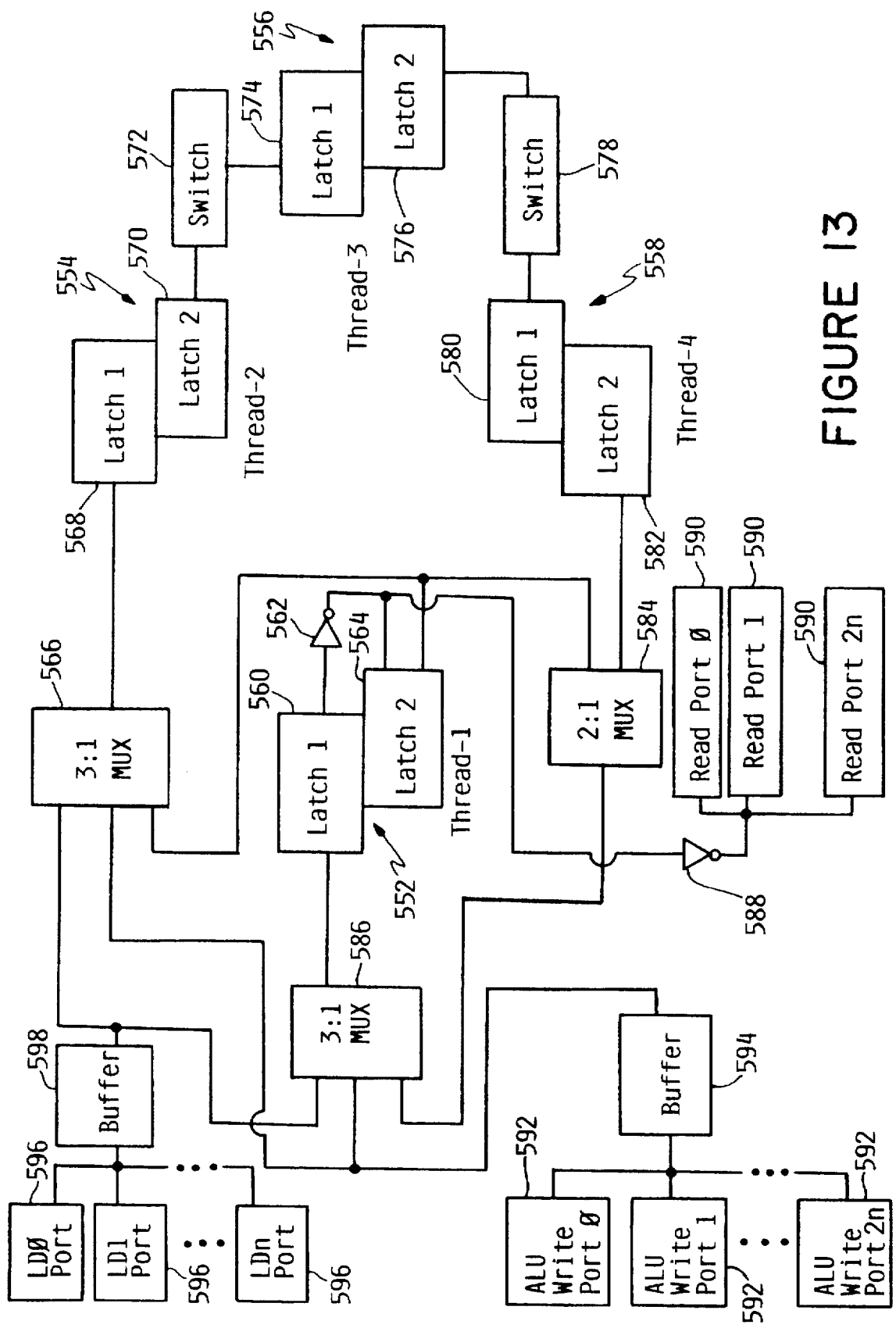
FIG. 13 is a block diagram depiction of a fourth embodiment of the multi-threaded storage cell of the present invention.

FIG. 13 depicts a block diagram of a fourth embodiment of the multi-threaded storage cell of the present invention. FIG. 13 depicts a four-threaded storage cell in which the four threads are represented by four storage elements 552–558 that are connected in a ring. To read or write the data corresponding to a particular thread, the contents corresponding to the desired thread ("thread-correspondent contents") are circulated, i.e., scanned, through the ring until they are located in the main storage element 552.

It is noted that FIG. 13 shows the main storage element 552 as corresponding to thread-1, the storage element 554 as corresponding to thread-2, the storage element 556 corresponding to thread-3, and the storage element 558 corresponding to thread-4, but that would change, e.g., if the contents were circulated/scanned one position so that the main storage element 552 would correspond to thread-4, with the storage element 554 then corresponding to thread-1, the storage element 556 then corresponding to thread-2, and the storage element 558 then corresponding to thread-3.

The main storage element 552 is formed from the latches 560 and 564, which are connected by the inverter 562. The storage element 554 is formed from the latches 568–570, with the latch 568 being connected to the latch 564 via the three-to-one multiplexer 566. The storage element 556 is formed from the latches 574–576, with the latch 574 being connected to the latch 570 via the switch 572. The fourth storage element 558 is formed from the latches 580–582, with the latch 580 being connected to the latch 576 via the switch 578. The latch 582 is connected to the latch 560 via the two-to-one multiplexer 584 and the three-to-one multiplexer 586. To reiterate, the path of the ring goes through the storage element 552, the 3:1 multiplexer 566, the storage element 554, the switch 572, the storage element 556, the switch 578, the storage element 558, the 2:1 multiplexer 584 and the 3:1 multiplexer 586. If necessary, the ring path can selectively be shortened by the 2:1 multiplexer 584, which can be controlled to select the output from the latch 564.

To read data out of the four-threaded storage cell of FIG. 13, data is passed from the latch 560 through the inverter 562 and the inverter 588 to the read ports 590, e.g., according to timing signals from a microprocessor (not shown) or discrete timing circuit (not shown). There are as many read ports 590 as there are functional units that can read data from the storage element 552.

Figure 14A:
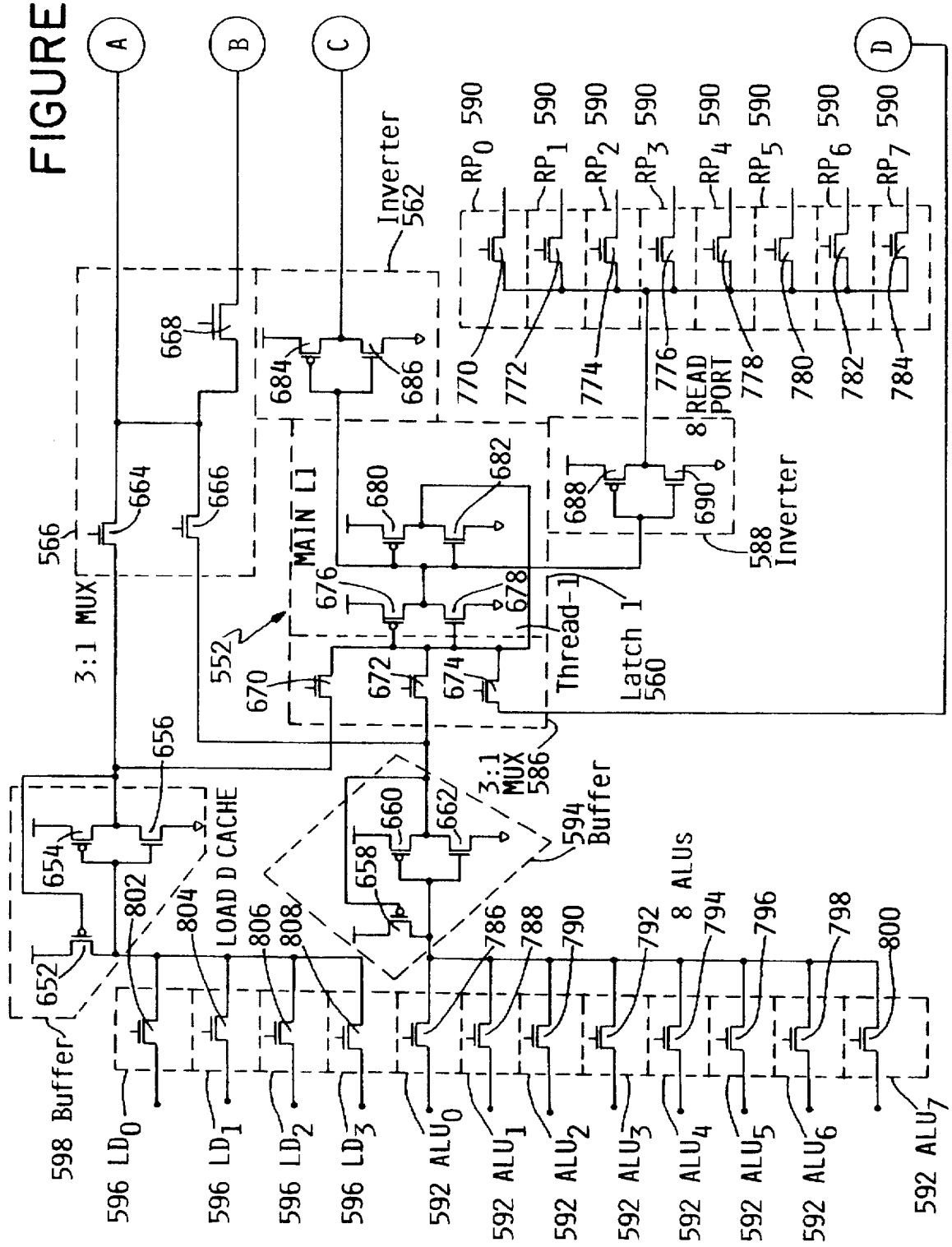
FIGS. 14a–14b are a schematic depiction of the embodiment of FIG. 13.
Figure 14B:
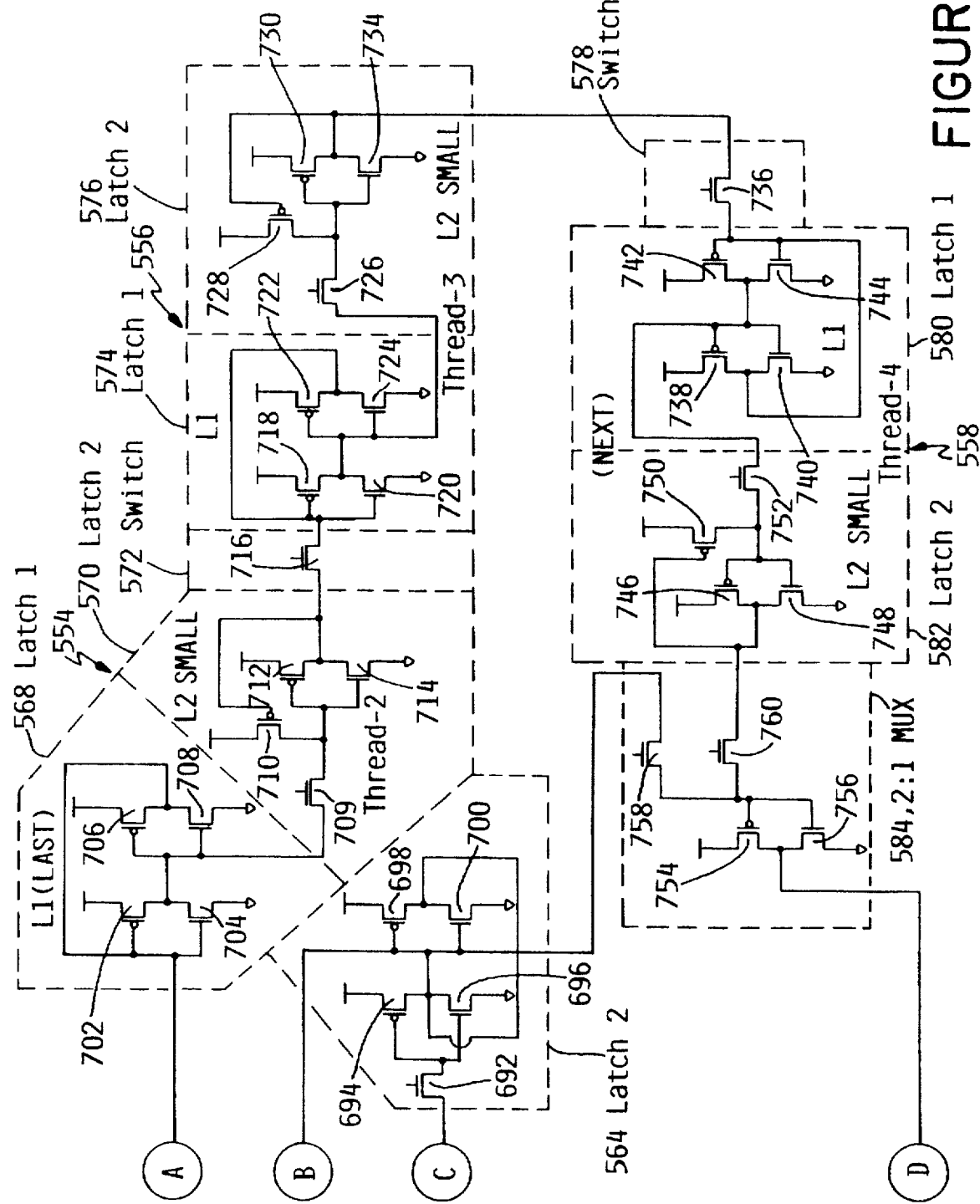

Scanning/circulation of the thread correspondent contents is controlled by timing signals from a controller (not shown), e.g., microprocessor, applied to transistors 674, 692, 668, 709, 716, 726, 736, 752, and 760. FIGS. 14a–14b, to be discussed in more detail below.

Data can be written into the four-threaded memory cell of FIG. 13 in one of four ways. The first way involves receiving data from functional units of the controller's arithmetic logic unit ("ALU") (not shown) at one of the ALU write ports 592. This data is passed through the buffer 594 and through the 3:1 multiplexer 586 into the latch 560. The second way of writing data is to pass data through the buffer 594 directly to, and through, the 3:1 multiplexer 566 into the latch 568 of the storage element 554. Such a bypass via the 3:1 multiplexer 566 would be done if less than all of the data had been written into the latch 560 of the main storage element 552 by the time the data in the ring had to be circulated, because of some time constraint.

The third and fourth ways of writing data concerns the load data ports 596. Data from a load port 596 is passed through the buffer 598 and either through the 3:1 multiplexer 586 into the storage element 552 or through the 3:1 multiplexer 566 into the storage element 554. Again, the load data ports 596 are provided with an alternate path to the ring so that an incomplete data-write operation into the storage element 552 can be cured by writing the remaining data into the storage element 554 after the contents corresponding to the desired thread had been circulated/scanned from the storage element 552 to the storage element 554.

FIGS. 14a–14b schematically depict the embodiment of the FIG. 3. The buffer 598 is formed from the transistors 652–656. Similarly, the buffer 594 is formed from the transistors 658–662. The buffers 598 and 594 are configured with feedback to prevent transmission of direct current ("DC") from the ports 596 and 592 to the 3:1 multiplexers 566 and 586, respectively.

The 3:1 multiplexer 586 is formed from the transistors 670–674. Similarly, the 3:1 multiplexer 566 is formed from the transistors 664–668. The latch 560 is formed from the transistors 676–682. The inverter 562 is formed from the transistors 684–686. The inverter 588 is formed from the transistors 688–690. The read ports 590 are formed from the transistors 770–784, respectively. The load data ports 596 are formed from the transistors 802–808, respectively. The ALU write data ports 592 are formed from the transistors 786–800, respectively.

The latch 564 is formed from the transistors 692–700. The latch 568 is formed from the transistors 702–708. The latch 570 is formed from the transistors 709–714. The switch 572 is formed from the transistor 716. The latch 574 is formed from the transistors 718–724. The latch 576 is formed from the transistors 726–734. The switch 578 is formed from the transistor 736. The latch 580 is formed from the transistors 738–744. The latch 582 is formed from the transistors 746–752. The 2:1 multiplexer 584 is formed from the transistor 754–760.

The present embodiments of multi-threaded memory cells have been shown as having two and four threads. These numbers of threads are exemplary and can be changed to suit the needs of the particular application. Similarly, the number of functional devices that can write to the storage elements of a multi-threaded cell or that can read from the storage elements of a multi-threaded cell are exemplary and can be changed to suit the particular application.

Each of the embodiments of the present invention, depicted in FIGS. 3–14b share a common attribute that thread-correspondent storage element content selection takes place within the cell. This common attribute has been implemented in the present embodiments according to two concepts: efficiently associating the data line to the data/storage-element, e.g., as in FIGS. 3–12; and efficiently bringing the data to the data line, e.g., as in FIGS. 13–14b. Moreover, each of the present embodiments takes advantage of the inventor's discovery that a multi-threaded memory having an optimized wireability (and an associated optimally minimized transistor count) can be achieved without substantial negative consequence, contrary to the prevailing thinking in the prior art, by eliminating read independence and/or write independence because (as a practical matter) these are negligible functional capabilities. Without the extra transistors necessary to achieve one or both of these functional capabilities, surface area economy can be increased.

As discussed above, the number of write ports and read ports depends upon the number of functional units than can write to, and read from, each cell in the memory, respectively. Generally, there will be at least two write ports and at least two read ports per cell. Exemplary combinations of write and read ports per cell include: 3 write ports and 6 read ports; and 12 write ports and 8 read ports.

The embodiments of the present invention, depicted in FIGS. 3–14b, can be used as a general purpose array for a multi-threaded computer, as a scannable general purpose array for a multi-threaded computer, as an array for a Very Long Instruction Word ("VLIW") computer, and as a content addressable memory for a multi-threaded computer.

The present embodiments have the advantage that additional threads can be added without the necessity of adding a separate set of write ports and read ports for each thread, due to the present use of thread selectors.

Again, the present embodiments also have the advantage that thread decoding is done within the cell, i.e., intra-cell thread decoding. This has the effect that the read performance, which is usually the most critical parameter, is unaffected by the addition of more threads.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. In a multi-threaded computer system using plural threads with a single processor, said single processor processing one thread at a time, a multi-threaded memory comprising:

a plurality of multi-threaded storage cells;

at least one write decoder supplying information to a selected one of the multi-threaded storage cells;

at least one read decoder accessing information from a selected one of the multi-threaded storage cells;

each of the multi-threaded storage cells including:

N storage elements, where N≧2, each of said N storage elements having a thread-correspondent content, a write interface, operatively connected to said at least one write decoder, and supplying information to said plural storage elements, and a read interface, operatively connected to said at least one read decoder, and reading information from said plural storage elements, at least one of said read and write interfaces selecting one of said thread-correspondent contents based at least in part by identifying the corresponding thread, thereby achieving intra-cell thread-correspondent content selection.

2. The multi-threaded memory of claim 1, wherein at least one of said interfaces includes:

an N-selector selecting one of the N storage elements corresponding to a selected thread; and at least one port connecting the N-selector to said at least one decoder in a ratio of one port per decoder.

3. The multi-threaded memory of claim 2, wherein the read interface includes an N-selector and one port per said at least one read decoder.

4. The multi-threaded memory of claim 3, wherein the write interface includes an N-selector and one port per said at least one write decoder.

5. The multi-threaded memory of claim 4, wherein the memory includes:

at least N decoders sufficient in number to ensure a ratio of at least one said decoder per storage element;

the write interface, for each storage element, including one port per said at least one decoder for operatively connecting the storage element to the decoder such that plural threads can be written to simultaneously.

6. The multi-threaded memory of claim 1, wherein the interfaces include ports formed of transmission gates.

7. The multi-threaded memory of claim 1, wherein the interfaces include ports formed of pass gates.

8. The multi-threaded memory of claim 1, wherein each of said storage elements is a master storage element, said multi-threaded storage cells further including, N slave storage elements, each corresponding to a master storage element, and scanning means, associated with each master/slave storage element pair, for using a slave storage element to verify data integrity in the corresponding master storage element.

9. The multi-threaded memory of claim 1, wherein the multi-threaded memory is a content-addressable memory;

the multi-threaded memory further including:

comparison means, associated with each multi-threaded storage cell, for comparing a bit value in a desired bit pattern with each of said thread-correspondent contents and identifying all matches.

10. The multi-threaded memory of claim 1, wherein the N storage elements in a multi-threaded storage cell are connected in a ring;

each interface is operatively connected to a storage element; and a thread selection is made by circulating the thread-correspondent contents in the storage elements through the ring until the contents corresponding to a desired thread are located in the storage element to which the interface is connected.

11. The multi-threaded memory of claim 10, wherein:

each storage element includes a pair of latches.

12. The multi-threaded memory of claim 10, wherein each multi-threaded storage cell includes:

an auxiliary write interface, connected to a different storage element than the other write interface, enabling access to a different point in the ring than the other write interface.

13. The multi-threaded memory of claim 10, wherein the write interface and read interface are connected to the same storage element;

each multi-threaded storage cell further including:

ring-bypass means for enabling the storage element, connected to the interfaces, to bypass the other storage elements in the ring when circulating thread-contents.

14. The multi-threaded memory of claim 1, wherein the memory includes at least two write decoders and at least two read decoders;

the write interface including, for each write decoder, at least one port per storage cell;

the read interface including, for each read decoder, at least one port per storage cell.

15. The multi-threaded memory of claim 14, wherein the memory includes one of a set of 3 write decoders and 6 read decoders and a set of 12 write decoders and 8 read decoders.

16. A microprocessor comprising a multi-threaded memory as in any one of claims 1–15.

17. In a multi-threaded memory formed from a plurality of multi-threaded storage cells for use in a multi-threaded computer system using plural threads with a single processor, said single processor processing one thread at a time, said processor including at least one write decoder supplying information to a selected one of the multi-threaded storage cells and at least one read decoder accessing information from a selected one of the multi-threaded storage cells, each multi-threaded storage cell including N storage elements, where $N \geq 2$, a write interface operatively connected to said at least one write decoder, and supplying information to said plural storage elements, and a read interface operatively connected to said at least one read decoder and reading information from said plural storage elements, a method of thread selection comprising the step of:

providing each of said N storage elements with a thread-correspondent content;

intra-cellularly selecting one of said plurality of thread-correspondent contents based at least in part by identifying the corresponding thread; and connecting the selected one of said plurality of thread-correspondent contents to said single processor through at least one of said write and read interfaces.

18. The method of claim 17 wherein said step of intra-cellularly selecting includes the step of indicating to the cell the thread upon which the single processor is processing.

19. The method as in claim 17, wherein the step of intra-cellularly selecting one of said plurality of thread-correspondent contents includes connecting a data line directly to one of said storage elements.

20. The method as in claim 17, wherein the step of intra-cellularly selecting one of said plurality of thread-correspondent contents includes shifting said plurality of thread-correspondent contents through said N storage elements until said one thread-correspondent contents resides in a storage element that is connected to one of said write interface and read interface.

21. In a multi-threaded computer system using plural threads with a single processor, said single processor processing one thread at a time, a multi-threaded memory comprising:

a plurality of multi-threaded storage cells;

at least one write decoder supplying information to a selected one of the multi-threaded storage cells;

at least one read decoder accessing information from a selected one of the multi-threaded storage cells;

each of the multi-threaded storage cells including:

N storage elements, where $N \geq 2$, each of said N storage elements having a thread-correspondent content, a write interface, operatively connected to said at least one write decoder, and supplying information to said plural storage elements, and a read interface, operatively connected to said at least one read decoder, and reading information from said plural storage elements, at least one of said read and write interfaces including:

an N-selector selecting one of the N storage elements corresponding to a selected thread; and at least one port connecting the N-selector to the at least one decoder in a ratio of at least one port per decoder.

22. The multi-threaded memory of claim 21, wherein the read interface includes the N-selector and has at least one port per said at least one read decoder.

23. The multi-threaded memory of claim 22, wherein the memory includes at least two write decoders in a ratio of at least one said write decoder per thread;

the write interface including:

a set, for each storage element, of at least one port per said write decoder such that plural threads can be written to simultaneously.

24. The multi-threaded memory of claim 21, wherein the memory includes at least two write decoders and at least two read decoders;

the write interface including, for each said write decoder, at least one port per storage cell;

the read interface including, for each said read decoder, at least one port per storage cell.

25. The multi-threaded memory of claim 24, wherein the memory includes one of a set of 3 write decoders and 6 read decoders and a set of 12 write decoders and 8 read decoders.

26. In a multi-threaded computer system using plural threads with a single processor, said single processor processing one thread at a time, a multi-threaded memory comprising:

a plurality of multi-threaded storage cells;

at least one write decoder supplying information to a selected one of the multi-threaded storage cells;

at least one read decoder accessing information from a selected one of the multi-threaded storage cells;

each of the multi-threaded storage cells including:

N storage elements, where N≧2, each of said N storage elements having a thread-correspondent content, a write interface, operatively connected to said at least one write decoder and at least on storage element, and supplying information to said plural storage elements, and a read interface, operatively connected to said at least one read decoder and at least one storage element, and reading information from said plural storage elements;

the N storage elements in a multi-threaded storage cell being connected in a ring;

a thread selection being made by shifting the thread-correspondent contents in the storage elements through the ring until the contents corresponding to a desired thread are located in the storage element to which the interface is connected.

27. The multi-threaded memory of claim 26, wherein:

each storage element includes a pair of latches.

28. The multi-threaded memory of claim 26, wherein each multi-threaded storage cell includes:

an auxiliary write interface, connected to a different storage element than the other write interface, enabling access to a different point in the ring than the other write interface.

29. The multi-threaded memory of claim 26, wherein the write interface and read interface are connected to the same storage element;

each multi-threaded storage cell further including:

ring-bypass means for enabling the storage element, connected to the interfaces, to bypass the other storage elements in the ring when circulating thread-contents.

30. The multi-threaded memory of claim 26, wherein the memory includes at least two write decoders and at least two read decoders;

the write interface including, for each said write decoder, at least one port per storage cell;

the read interface including, for each said read decoder, at least one port per storage cell.

31. The multi-threaded memory of claim 30, wherein the memory includes one of a set of 3 write decoders and 6 read decoders and a set of 12 write decoders and 8 read decoders.

32. In a multi-threaded computer system using plural threads with a single processor, said single processor selecting a cell and a thread therein to be processed and processing one thread at a time, a multi-threaded memory comprising:

a three-dimensional array of storage elements organized as a two-dimensional array of cells, each cell having a plurality of storage elements, a first dimension of said array corresponding to a number of cells in said array, a second dimension corresponding to a number of bits per one of said storage elements, and a third dimension corresponding to a number of threads per one of said cells, where each one of said storage elements in a cell is operable to store a thread; and one of a first combination of a write decoder for decoding write addresses of cells in said array and a read decoder for decoding read addresses of cells in said array, a second combination of a said write decoder and at least two said read decoders, and a third combination of said read decoder and at least two said write decoders.

33. The multi-threaded memory of claim 32, further comprising:

a plurality of thread selectors, corresponding to said cells, for selecting storage elements in said cells corresponding to selected threads, respectively.

34. The multi-threaded memory of claim 33, wherein said array is operable so that thread selection by said single processor is independent of an address access to said array by said single processor.

35. The multi-threaded memory of claim 32, wherein each of said cells is configured as a ring of storage elements, and each of said thread selectors is operable to circulate contents of said storage cells until a desired thread is located at a desired point on the ring.

* * * * *